United States Patent [19]
Washkurak et al.

[11] Patent Number: 5,602,407
[45] Date of Patent: Feb. 11, 1997

[54] SWITCHED CCD ELECTRODE PHOTODETECTOR

[75] Inventors: William D. Washkurak; Savvas G. Chamberlain, both of Waterloo, Canada

[73] Assignee: Dalsa, Inc., Canada

[21] Appl. No.: 563,752

[22] Filed: Nov. 29, 1995

Related U.S. Application Data

[63] Continuation of Ser. No. 251,376, May 31, 1994, abandoned.

[51] Int. Cl.$^6$ .................... H01L 27/148; H01L 29/768; G11C 19/28
[52] U.S. Cl. ................. 257/223; 257/229; 377/58; 377/60
[58] Field of Search ..................... 257/223, 229, 257/239, 230; 377/58, 60

[56] References Cited

U.S. PATENT DOCUMENTS

| | | | |
|---|---|---|---|
| 3,953,733 | 4/1976 | Levine | 257/229 |
| 4,377,755 | 3/1983 | Jensen | 257/239 |
| 4,473,836 | 9/1984 | Chamberlain | 257/290 |
| 4,489,423 | 12/1984 | Suzuki | 257/223 |
| 4,527,182 | 7/1985 | Ishihara et al. | 257/223 |
| 4,598,414 | 7/1986 | Dries et al. | 257/229 |
| 4,873,561 | 10/1989 | Wen | 257/229 |
| 4,958,207 | 9/1990 | Suni et al. | 257/229 |
| 4,967,249 | 10/1990 | Suni | 257/220 |
| 5,235,197 | 8/1993 | Chamberlain et al. | 257/230 |

OTHER PUBLICATIONS

"High–Speed Multiple Channel TDI Camera For Document Scanning Applications", [1901–15], M. Miethig, D. Prince B. C. Doody, P. T. Jenkins, D. J. Blaklock, D. DuVall, SPIE vol. 1901 *Cameras, Scanners, and Image Acquisition Systems* (1993), pp. 148–151. No month.

"High Speed Low Noise, Fine–Resolution TDI CCD Imagers", [1242–30], S. G. Chamberlain, W. D. Washkurak, S. G. Chamberlain, W. D. Washkurak, SPIE vol. 1243, *Charge–Coupled Devices and Solid STate Optical Sensors* (1990), pp. 252–262. No month.

"A Wide Dynamic Range Tapped Linear Array Image Sensor", Washkurak, et al., SPIE, *Advances in Optical Information Processing III*, Pape, ed., vol. 936 (1988), pp. 14–21. No month.

"A HIgh Speed, Wide Dynamic Range Linear DYNASENSOR CCD Detector Array For Acoustic–Optic Applications", Washkurak, et al., SPIE *Infrared Technology XIV*, Spiro, ed., vol. 972 (1988), pp. 388–395. No month.

"A Photodetector Array for Acousto–Optic Signal Processors", *Canadian Journal of Physics*, by R. J. Inkol, W. D. Washkurak and S. G. Chamberlain, vol. 7, No. 4, pp. 400–407, 1989 no month.

*Primary Examiner*—Gene M. Munson
*Attorney, Agent, or Firm*—Banner & Witcoff, Ltd.

[57] ABSTRACT

A switched CCD electrode photodetector includes a substrate made of first semi-conductor type, a drain made of a second semi-conductor type formed in the substrate, a collection well made of the second semi-conductor type formed in the substrate, and a switched CCD electrode resistor formed between the drain and the collection well. The collection well is operable in cooperation with a photosensitive region. The switched CCD electrode resistor includes a channel region defined in the substrate and having a first end disposed adjacent to the collection well and a second end disposed adjacent to the drain. The switched CCD electrode resistor also includes a first electrode insulatively spaced from and disposed over the first end and a second electrode insulatively spaced from and disposed over the second end.

34 Claims, 11 Drawing Sheets

5,602,407

SWITCHED CCD ELECTRODE PHOTODETECTOR

This application is a continuation, of application Ser. No. 08/251,376, filed May 31, 1994 now abandoned.

FIELD OF THE INVENTION

This invention relates in general to photodetectors, and more particularly to a wide dynamic range CCD photodetector having high photosensitivity and high speed at low light levels.

BACKGROUND OF THE INVENTION

Photodetectors are known in consumer and industrial electronics for detecting light and, in response thereto, generating a signal proportional thereto. For example, photodetectors have been integrated with CCD image sensors to form linear and area arrays useful in video technology. Linear CCD image sensors that achieve high speed and high photosensitivity over a wide dynamic range of light intensities are useful in applications such as laser beam profiling, acousto-optic signal processing and welding. Dynamic range is defined as the ratio of maximum to minimum detectable light intensity. The ratio is represented as either a number of orders of magnitude or in dB power. Wide dynamic range (WDR) photodetectors are those that achieve greater than 30 dB (3 orders) of dynamic range—typically 60 dB (6 orders).

The basic concept behind building a wide dynamic range photodetector is to implement a compression structure that becomes effective under high illumination conditions (>30 dB where 0 dB is referenced to the minimum detectable light intensity). For lower intensity illumination (0–30 dB) the detector should operate in an integration mode for maximum sensitivity.

Additional features important to such photodetectors include a tolerance or immunity to the effects of image lag, efficiency in transferring low level signal charge (less than 100 electrons) into the readout shift register, and achievement of WDR performance at short integration times (1 to 200 μs).

The basic principle behind any wide dynamic range technique is to discard a controlled portion of the total number of photogenerated electrons collected. The effect is to compress the total number of photogenerated electrons into a smaller representative charge packet that can then be transferred into the readout CCD shift register of the image sensor. Wide dynamic range typically has been achieved using one or a combination of two compression techniques: exploitation of subthreshold current flow over a barrier (described in U.S. Pat. No. 4,473,836 to Chamberlain) and signal charge partitioning based on collection well areas.

The charge partitioning compression technique is based on partitioning the collected photogenerated charge at high light levels into two components of which, the smaller one, is transferred into the readout CCD shift register. FIG. 1 shows a partitioning photodetector potential well diagram. Illumination of the 'signal charge' potential well results in complete signal charge collection at low levels due to the depth of the 'signal charge' potential well compared to an adjacent 'excess charge' potential well. At higher light levels, photogenerated signal charge units overflow and accumulate in the 'excess charge' potential well so that at the end of the integration time when the 'partition gate' is turned 'off', a fraction of the total quantity of photogenerated signal charge units remains in the 'signal charge' potential well for subsequent transfer into the readout CCD shift register.

With this type of detector, the amount of signal charge divided away (compression ratio) depends on the area ratios of the two potential wells. Ratios of greater than 100:1 become impractical due to layout restrictions and charge dynamics; charge dynamics for electron transfer across the 'excess charge' well become prohibitively long.

U.S. Pat. No. 4,473,836 to Chamberlain, which is incorporated herein by reference, discloses an integrated wide dynamic range photodetector element for linear and area integrated circuit imaging arrays. This patent teaches a CCD image sensor technology with a photoelement for providing input power detection of a dynamic range greater than one million. The photodetector has been used successfully to form wide dynamic range CCD linear image sensor arrays.

Subsequent improvements have been made to the aforenoted photodetector, as reported in the following publications:

1. B. C. Doody and S. G. Chamberlain, "An improved wide dynamic range silicon photodetector for integration in image sensor arrays", Canadian Journal of Physics, Vol. 65, no. 8, pp. 919–923, 1987.
2. S. G. Chamberlain, B. C. Doody and W. D. Washkurak, "A high photosensitivity wide dynamic range linear image sensor array", Electronic Imaging, pp. 170–175, Mar. 28–31, 1988.
3. W. D. Washkurak, S. G. Chamberlain, and N. D. Prince, "High Speed wide dynamic range linear CCD detector for acousto-optic applications", SPIE Symposium and Advances in Optical Information Processing, Orlando, Fla., pp. 1–9, Apr. 4–8, 1988.

Although the wide dynamic range CCD photodetector discussed in the above references is capable of detecting an input power dynamic range greater than one million in commercial CCD linear image sensor arrays, the device nevertheless suffers from a number of technological limitations.

Firstly, as with other known photodetectors, the photosensitivity or NEP (noise equivalent power) of the above-discussed wide dynamic range photodetector is a function of its own capacitance.

Secondly, the above-mentioned capacitance of the photodetector also results in a slow speed of operation in the presence of short light pulses.

Thirdly, the photodetector exhibits poor photosensitivity response in the presence of short incoming light power pulses.

Finally, during the charge transfer process of the video signal into a CCD readout shift register of the photodetector, the signal may be contaminated, or smeared, by incoming incident illumination. Furthermore, blooming can also occur at high light levels.

In U.S. Pat. No. 5,235,197, granted Aug. 10, 1993 to Chamberlain and Washkurak (the inventors of the present invention), which is incorporated herein by reference, a photodetector exhibits high speed and high sensitivity detection at low light intensity and is also capable of wide dynamic range detection. In FIGS. 2A to 2C of this application, photodetector 1 is illustrated in accordance with an embodiment described in U.S. Pat. No. 5,235,197. Photodetector 1 comprises photosensitive region 2 which is in the form of an n+ diffusion into p-type semiconductor substrate 3.

In accordance with known principles of semiconductor physics, signal electrons 4 are generated within photosensitive region 2 in response to illumination of the photosensitive region by light photons of frequency defined by the photons' energy (hv) as shown in the potential well diagram of FIG. 2C.

Signal electrons 4 are collected in collection well 5 which comprises a further n+ diffusion in p-type substrate 3.

Finally, signal electrons 4 are output via a CCD readout shift register comprising n-type buried layer 6 forming an active region of the shift register, transfer gate 7 of a first level polysilicon and CCD clocking gate 8 of a second level polysilicon. Transfer gate 7 and CCD clocking gate 8 are clocked via signal pulses TCK and $\phi_{CCD}$, respectively.

In accordance with an aspect of this embodiment, transfer gate 9 is disposed intermediate to photosensitive region 2 and signal electron collection well 5, as will be discussed in greater detail below. Transfer gate 9 is clocked via a signal BCK.

Profiled device 10 is provided with a drain terminal connected to a source of bias voltage VPB and gate and source terminals interconnected via metalization layer 11, and further connected to the n+ collection well 5.

The combination of the n+ collection well 5 and profiled device 10 shown in FIGS. 2A and 2B relates to the wide dynamic range device described in U.S. Pat. No. 4,473,836, with the exception that collection well 5 as described herein is not a photosensitive region.

Instead, photosensitive region 2 is isolated by transfer gate 9. As shown in the potential well diagram of FIG. 2C, during integration and photocollection times, photogenerated electrons 4 initially collect in the potential well of the n+ photosensitive region 2. The signal BCK is maintained at a high level such that transfer gate 9 is open (i.e., connected as a closed circuit) and photogenerated electrons 4 are free to drift and diffuse into and collect in collection well 5. This is shown in the potential well diagram of FIG. 2C. The collection well voltage under dark conditions (i.e., no illumination of photosensitive region 2) is set to Vdn5 by means discussed below. As a result of photogenerated signal electrons collecting within collection well 5, the collection well voltage decreases (i.e., becomes more negative) in accordance with the quantity of charge units collected. The collection well voltage (Vph) changes logarithmically as a function of the light intensity incident on photosensitive region 2. The change of the collection well voltage at collection well 5 ($\Delta$Vph) is a function of the photocurrent and is given by:

$$\Delta V_{ph} = K \ln \frac{I_{ph}}{I_{dc}} \quad (1)$$

In equation 1, K represents the responsivity of the photodetector between incident light and voltage, $I_{dc}$ represents the leakage current from collection well 5 and $I_{ph}$ represents the photocurrent from photosensitive region 2 and is given by $$I_{ph} = \frac{qn\lambda HA}{hc} \quad (2)$$

In equation 2, q is the electron charge in coulombs, n is the quantum efficiency, H is the light intensity in watts per square cm, $\lambda$ is the wavelength of the incoming light in cm, h is a Planck's constant, c is the speed of light, and A is the area of the photosensitive diffusion region 2.

The collection well voltage at collection well 5 under dark conditions (i.e., Vdn5) is set through profiled device 10.

Note that a condition at collection well equivalent to dark conditions exists when transfer gate 9 is shut off (i.e., disconnected as an open circuit). The voltage VPB is a DC bias supplied externally to device 10. The potential of photosensitive region 2 under dark conditions is set to Vdn2 by reset gate 12 and common drain bias VPR applied to drain diffusion 13. Once this potential is set, control signal voltage PR is set to zero potential, thereby isolating common drain 13 from photosensing region 2. Drain 13, gate 12, bias voltage VPR and signal voltage PR constitute a means for resetting the potential of photosensitive region 2 to Vdn2.

In operation, charge is detected and shifted out of photodetector 1 by initially applying a low logic level voltage BCK to transfer gate 9 and a high logic level voltage PR to reset gate 12 for blocking charge transfer between regions 2 and 5 while resetting the potential of photosensitive region 2 to Vdn2, as discussed above. Next, the voltage PR drops to zero potential for isolating drain region 13 from photosensitive region 2. In response to illumination, signal electrons 4 are generated within photosensitive region 2. The BCK signal goes to a high logic level so that signal electrons 4 are free to drift and diffuse into collection well 5 which, as discussed above, is preset to a potential Vdn5 (for dark conditions), Vdn5 being more positive than the potential Vdn2 of photosensitive region 2.

Next, signal electrons 4 are transferred to the CCD readout shift register 6 by alternately pulsing the TCK and $\phi_{CCD}$ signals applied to gates 7 and 8. See the orientation of 5, 6, 7 and 8 shown in FIG. 2A. At the same time as signal electrons 4 are being transferred to the CCD readout shift register, transfer gate 9 is disabled (i.e., disconnected as an open circuit) by applying a low logic level signal BCK thereto, for isolating photosensitive region 2 from collection well 5.

The photodetector of FIGS. 2A and 2B is characterized by two important advantages over prior photodetectors.

Firstly, the dimensions of collection well 5 can be made very small. This leads to a small node capacitance at collection well 5. A decrease in the capacitance results in a significant increase in the speed of response of the photodetector without sacrificing photosensitivity. Light pulses of width 90 nanoseconds or less can be detected at low light levels in accordance with this embodiment. In conventional wide dynamic range photodetectors, any attempt to decrease the sensing node capacitance also results in significant decreases in photosensitivity, as discussed above.

Secondly, according to the photodetector of FIGS. 2A and 2B, during charge transfer of the signal into CCD readout shift register 6, transfer gate 9 is disabled. Therefore, the signal which is stored in collection well 5 is isolated from photosensitive region 2. This ensures that the incoming light incident to photosensitive region 2 does not contaminate, smear or bloom the sampled video signal.

At the end of the integration period and after the signal charge has been transferred into readout shift register 6, photosensitive region 2 is reset to the potential VPR by enabling gate 12 in response to applying a high logic level signal PR thereto.

It is desirable to make collection well 5 even more compact and eliminate device 10 from the photodetector in order to make more compact photodetectors; however, wide dynamic range performance, high speed performance and low-light level sensitivity performance should not be sacrificed.

SUMMARY OF THE INVENTION

It is an object of this invention to provide a wide dynamic range photodetector with low light level sensitivity and high speed (e.g., high slew rate) performance.

It is another object of the present invention to provide a photodetector with a linear response and a high detection sensitivity in an uncompressed low light level region of operation and with a linear response and a lower detection sensitivity in a compressed high light level region of operation.

It is yet another object of the present invention to provide a means to set a light level threshold demarking a transition between the uncompressed and compressed regions of operation, the means being controllable externally to the photodetector.

It is yet another object of the present invention to provide a means to set a wide dynamic range compression ratio, the means being controllable externally to the photodetector.

These and other objects are achieved in a CCD photodetector. The photodetector includes a substrate made of a first semi-conductor type, a drain made of a second semiconductor type formed in the substrate, a collection well made of the second semiconductor type formed in the substrate, and a switched CCD electrode resistor formed between the drain and the collection well. The collection well is operable in cooperation with a photosensitive region. The switched CCD electrode resistor includes a channel region defined in the substrate and having a first end disposed adjacent to the collection well and a second end disposed adjacent to the drain. The switched CCD electrode resistor also includes a first electrode insulatively spaced from and disposed over the first end and a second electrode insulatively spaced from and disposed over the second end.

BRIEF DESCRIPTION OF THE DRAWINGS

The invention will be described in the following description of preferred embodiments with/reference to the following figures wherein.

DETAILED DESCRIPTION OF PREFERRED EMBODIMENTS

The present invention comprises a compression technique based on switched CCD electrodes. Compression is based on discarding excess signal charge through the switched CCD electrodes that are clocked at a clock frequency which is preferably an order of magnitude greater than the frame rate. The frame rate is the reciprocal of the integration period. These switched CCD electrodes implement a high valued resistor in the channel region between the collection well and the drain, and the clocking rate, among other factors, defines the value of this resistor.

Figure 1:
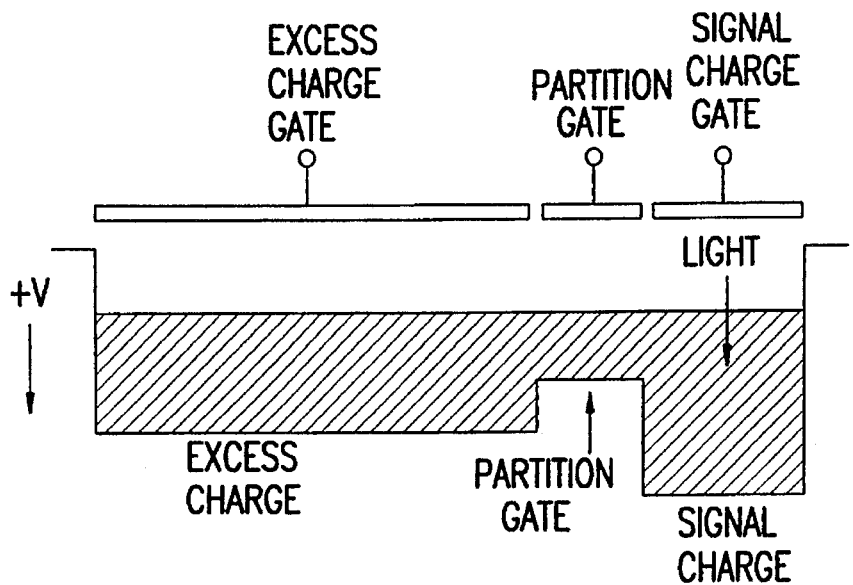
FIG. 1 is a potential well diagram showing the structure of a conventional partitioning photodetector.
Figure 3:
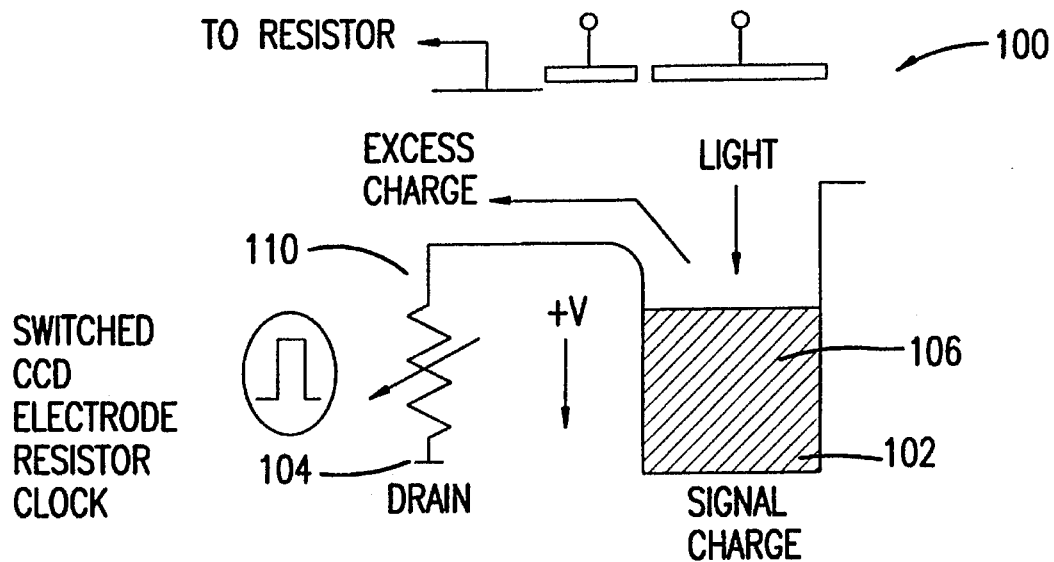
FIG. 3 shows a combined schematic diagram and potential well diagram of a, switched CCD electrode photodetector.
Figure 2A:
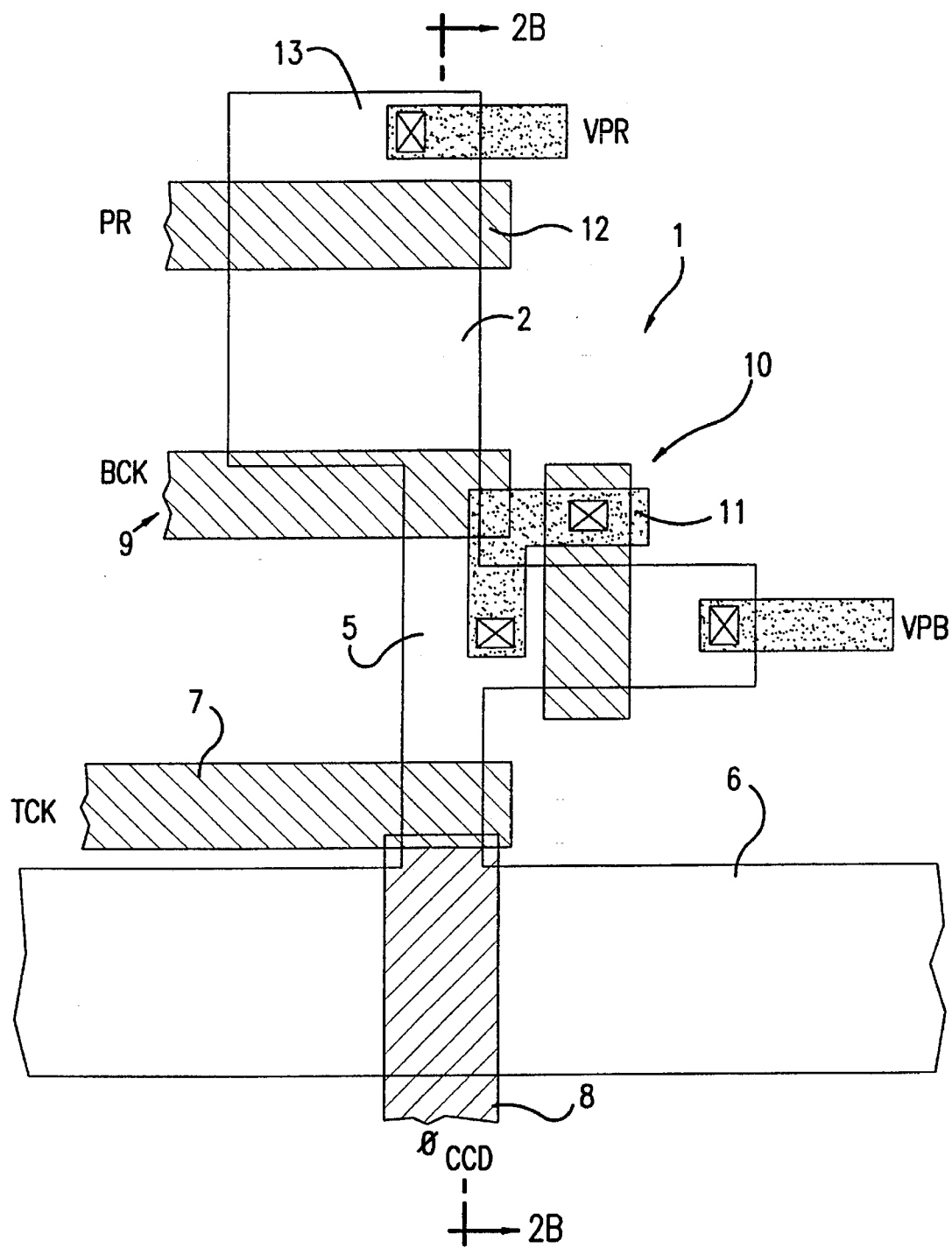
FIG. 2A is an integrated circuit layout for a barrier type compression photodetector.
Figure 2B:
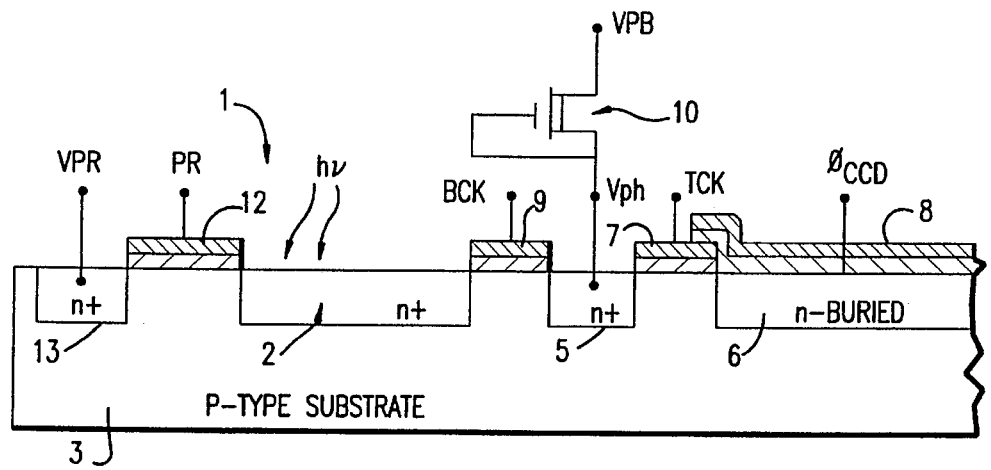
FIGS. 2B and 2C form a combined cross-sectional view and potential well diagram of the barrier type photodetector shown in FIG. 2A.
Figure 2C:
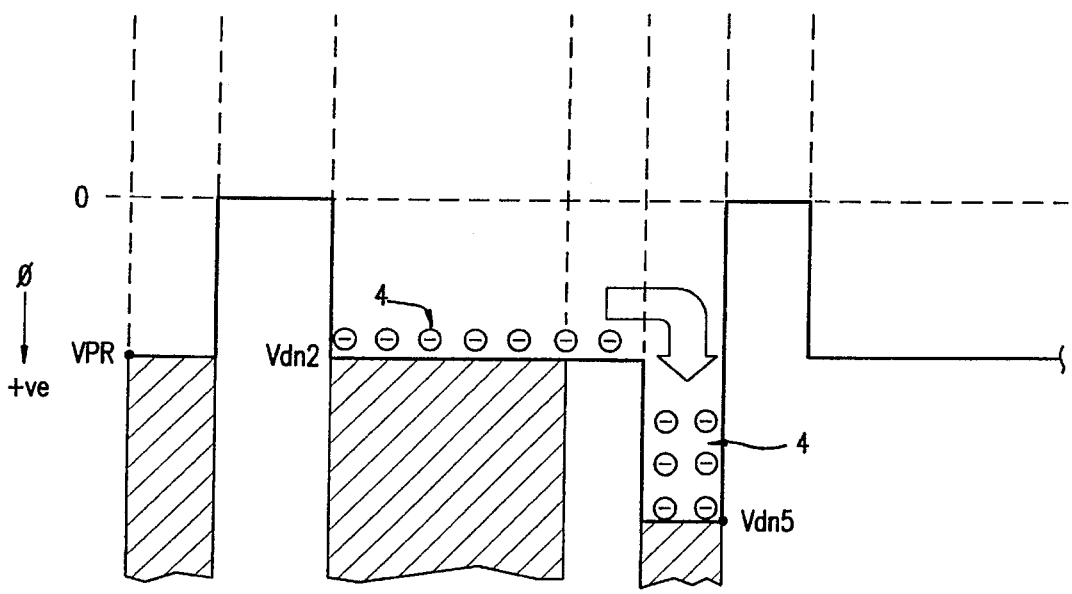

FIG. 3 shows a potential well diagram of switched CCD electrode photodetector 100 where the switched CCD electrode resistor is schematically represented as variable resistor 110. For low light level signals, charge units are collected in collection well 102 only since the integration period is insufficiently long to collect enough charge units to overflow collection well 102. For high light level signals, switched CCD electrode resistor 110 extracts excess signal charge linearly into drain diffusion 104. The rate at which signal charge is extracted can be controlled by the switching frequency which controls the resistance value of switched CCD electrode resistor 110. Before discussing the switched CCD electrode implementation, operation of the compression with a resistor is discussed.

As soon as photogenerated signal charge 106 overfills signal charge potential well (i.e., collection well) 102, charge units start to flow through resistor 110. After a few RC time constants (resistance times the capacitance of the collection weld a voltage drop across the resistor is attained that sustains the photogenerated current. The voltage drop is a function of the photogenerated current. This voltage drop causes additional signal charge to be retained in the collection well that supplements the signal charge that is subsequently transferred into a readout CCD shift register. As a result, signal charge compression is achieved through the use of the resistor.

The value of the resistor sets the level of compression. If it is a fixed value, the resistor value must be optimized for a given photodetector integration time and the level of compression desired. For example, given the following conditions:

1. A 2 volt drop across the resistor is required when the illumination level is two orders of magnitude (20 dB) above the level that just fills the collection well to the barrier potential during an integration time (30 dB);
2. The signal charge level that just fills the collection well to the barrier
potential is 250,000 electrons; and
3. The integration time is 10 μs; the resistance required can be calculated using Ohms law:

$$R_F = \frac{2 \text{ Volts } 10 \text{ μs}}{q(250,000 e^-)(100)} = 5 \text{ M}\Omega. \quad (3)$$

If a longer integration time is required, the photogenerated current level will scale down accordingly and a larger valued resistor for the same voltage drop will be required. Using $R_F$=5MΩ and assuming a typical collection well capacitance of approximately 50fF, a time constant of 250 ps results. Compared to the 10 μs integration time, the bandwidth of the detector is more than sufficient to achieve steady state operation across the resistor.

Figure 4A:
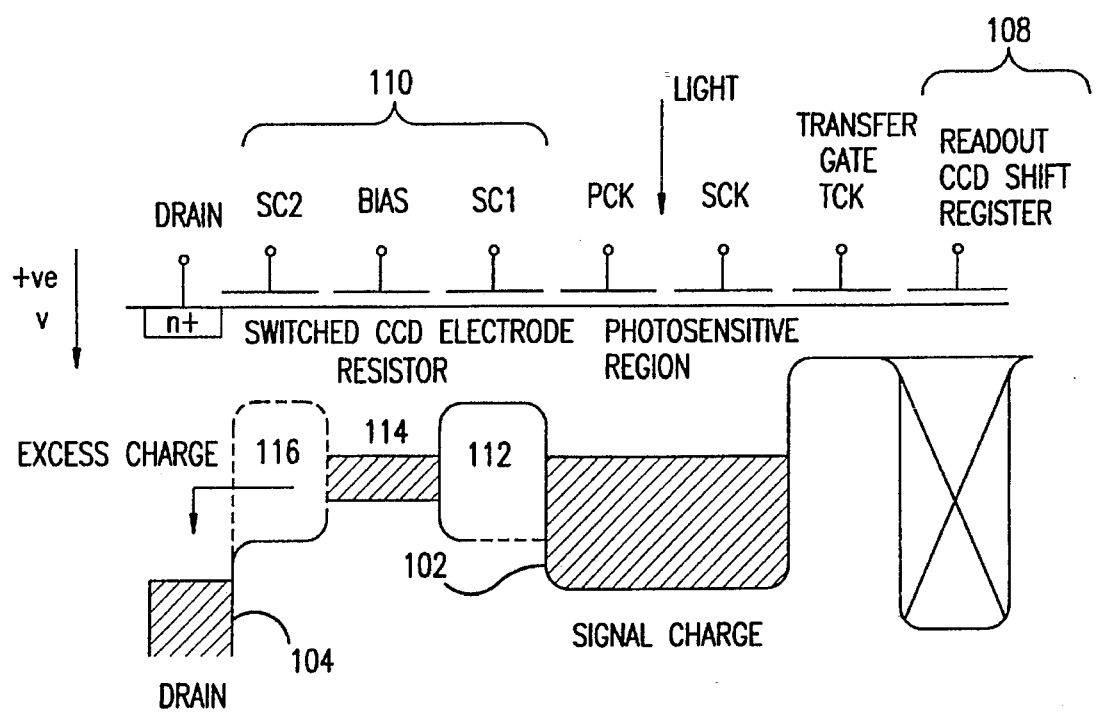
FIGS. 4A and 4B form a combined cross-sectional view and potential well diagram of the photodetector shown in FIG. 3.
Figure 4B:
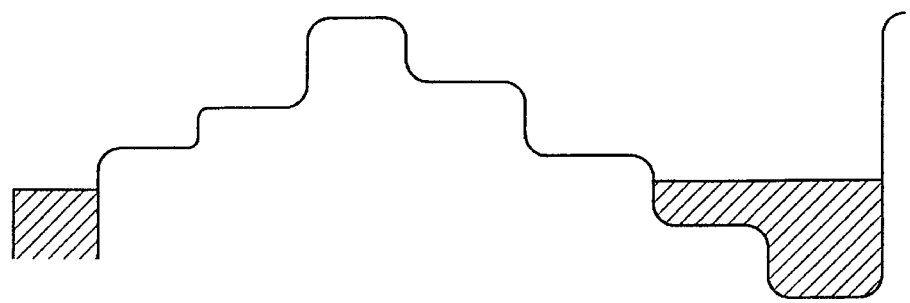
Figure 5:
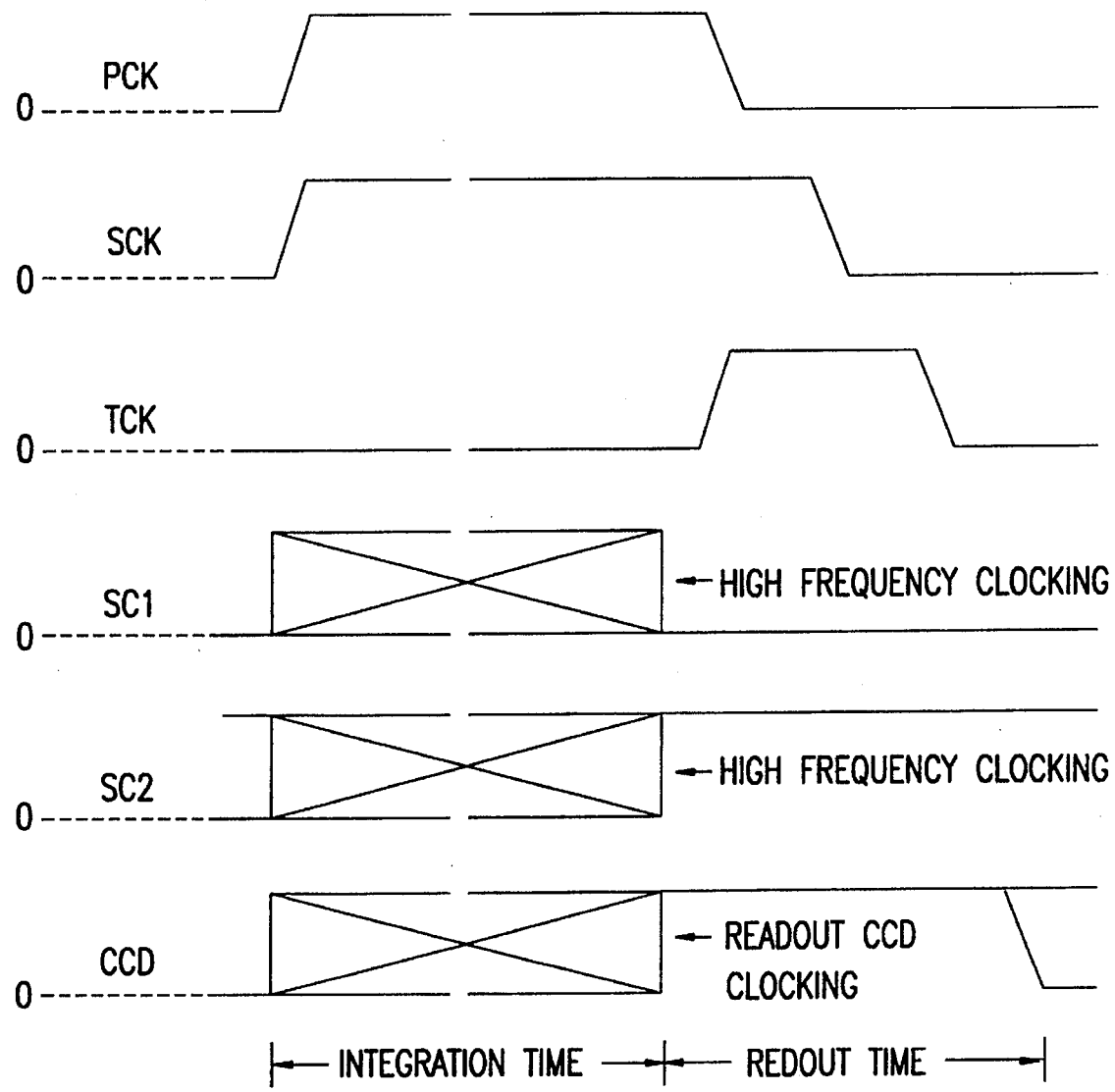
FIG. 5 is a timing diagram showing the timing of signals supplied to the switched CCD electrode photodetector.

Resistors can be implemented using many different techniques, however, the challenge here is to implement a resistor in the 10 to 500 MΩ range. This leads to a switched capacitor type resistor implementation. A potential well diagram and crosssection of the photodetector is shown in FIG. 4A. Switched CCD electrode resistor 110 includes a channel region disposed between collection well 102 and drain 104, the channel region being comprised of two end regions 112, 116 and a central region 114. The switched CCD electrode resistor is realized by three adjacent gate electrodes driven by signal voltages SC1, BIAS and SC2, each electrode being insulatively spaced from and disposed over the channel region between collection well 102 and drain 104. Disposed over collection well 102 are two electrodes driven by signal voltages PCK and SCK. An electrode driven by signal voltage TCK is used to control transfer of charge units from collection well 102 into readout CCD shift register 108. The drain discards the current that flows through switched CCD electrode resistor 110. For low light level operation photocharge units are collected entirely in collection well 102, a depth of potential of collection well 102 being defined by the PCK/SCK electrode potentials. At high light levels, charge units in collection well 102 overflow into the channel region between collection well 102 and drain 104, a potential barrier for which is defined by the voltage applied to the electrode driven by SC1 and disposed over first end 112 of the switched CCD electrode resistor. SC1 and SC2 are clocked at a frequency which is preferably an order of magnitude greater than the frame rate (i.e., the reciprocal of the integration period) in a non-overlapping inverted manner with respect to each other such that at all times at least one electrode has applied to it a voltage which causes an unpassable potential barrier. With each cycle of the SC electrodes, a charge packet is discarded into drain 104. The amount of charge discarded is proportional to the potential difference between collection well 102 with its then accumulated signal charge and a potential of an empty central region 114 of the channel, the potential produced in the central channel region being defined by a voltage BIAS applied to an electrode disposed over central region 114. Equilibrium between photogenerated current and switched CCD electrode resistor current is reached when a collection well voltage is proportional to the photogenerated current. At the end of the integration period, the SC1 voltage applied to the corresponding electrode is controlled so as to cause a potential barrier in the channel under the electrode, a barrier through which a charge current cannot flow, and PCK, SCK and TCK are sequentially collapsed (see FIG. 4B) so as to transfer the signal charge from collection well 102 into CCD readout shift register 108 as shown in the potential well diagram of FIG. 4B. FIG. 5 shows a clock timing diagram.

Figure 6:
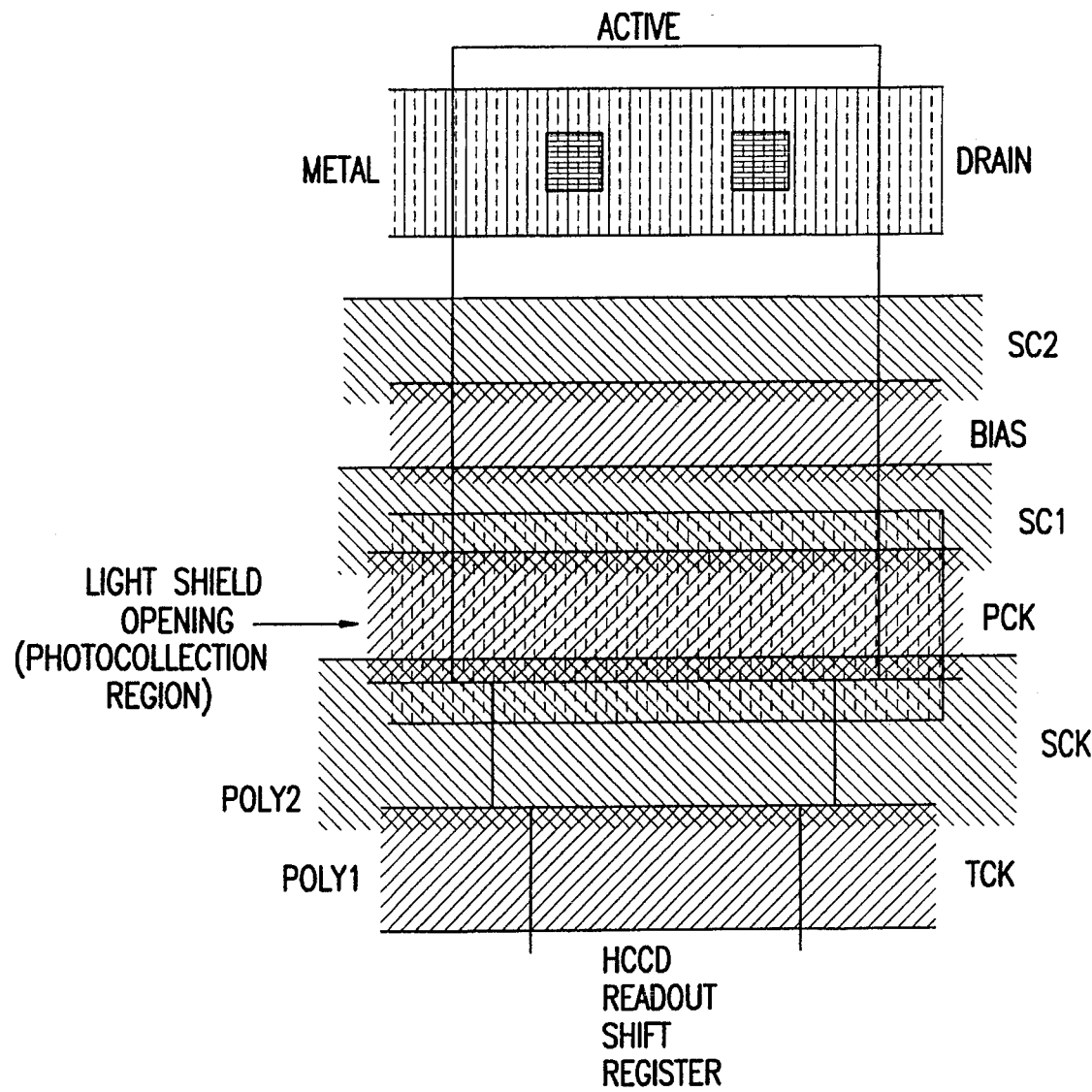
FIG. 6 is a layout diagram showing the linear layout of the switched CCD electrode photodetector.

A layout of the device is shown in FIG. 6. The layout is simple due to the serial nature of the device. Each electrode only needs to interact with its adjacent neighbors eliminating any complicated interconnectivity. It is ideally suited to CCD type processes.

As mentioned previously, the size of the resistance implemented with the switched CCD electrodes determines the level of compression. For example, assuming a photodetector with a 150 μs integration and with a collection well capacity of 150,000 electrons before compression starts, the resistor value required to achieve a 2 V voltage drop across the resistor for 20 dB operation (100 times operation) in the compressed state using Ohm's law is:

$$R = 2 \text{ Volts} \left( \frac{q(150{,}000 e^-)(100)}{150 \text{ μs}} \right)^{-1} = 125 \text{ M}\Omega. \quad (4)$$

The term in brackets is the photogenerated current. If the collection well capacitance is 25 fF, a time constant of 3.1 μs or 2.1% of the integration time results. After a few time constants a voltage drop across the resistor is attained that will sustain the photogenerated current. Compared to the 150 μs integration time, the bandwidth of the detector is more than sufficient to achieve steady state across the resistor.

Resistors of this size are difficult to implement without some kind of switch capacitor technique; a few orders of magnitude reduction in silicon area is achievable using such techniques with the resistance values required. The present switched CCD electrode resistor concept has adjacent gate electrodes without intervening source/drain diffusion regions required by conventional MOS transistor switched capacitor resistors. This present invention is similar to a conventional switched capacitor implementation except the intervening source drain diffusions have been eliminated, and the size of the whole device is reduced. The switched CCD electrode structure offers additional reduction in area over the switched capacitor structure. The sequential dumping of charge packets at a given rate results in a current flow whose magnitude depends on the change of the BIAS channel potential which can be controlled externally to the photodetector. This changing current as a function of a potential can be modelled as a resistor. The amount of charge partitioned into the bias well, $Q_{BIAS}$ is:

$$Q_{BIAS} = C_{BIAS} \Delta V_{WELL} \quad (5)$$

where $\Delta V_{WELL}$ is the collection well potential difference between collection well 102 and empty central region 114 (i.e, a BIAS well) and $C_{BIAS}$ is the central region 114 capacitance. The current $I_{RSC}$ is:

$$I_{RSC} = \frac{Q_{BIAS}}{T_{sc}}. \quad (6)$$

where $T_{sc}$ is the switched CCD electrode clock period. The resulting switched CCD electrode resistance $R_{SC}$ is:

$$R_{SC} = \frac{T_{SC}}{C_{BIAS}}. \quad (7)$$

In the case of a 150 μs integration time a suitable switched CCD electrode clock period (typically less than one tenth of the integration period) is 2 μs. Using $C_{BIAS}$ of 16 fF, $R_{SC}$ is 125 MΩ.

Figure 7:
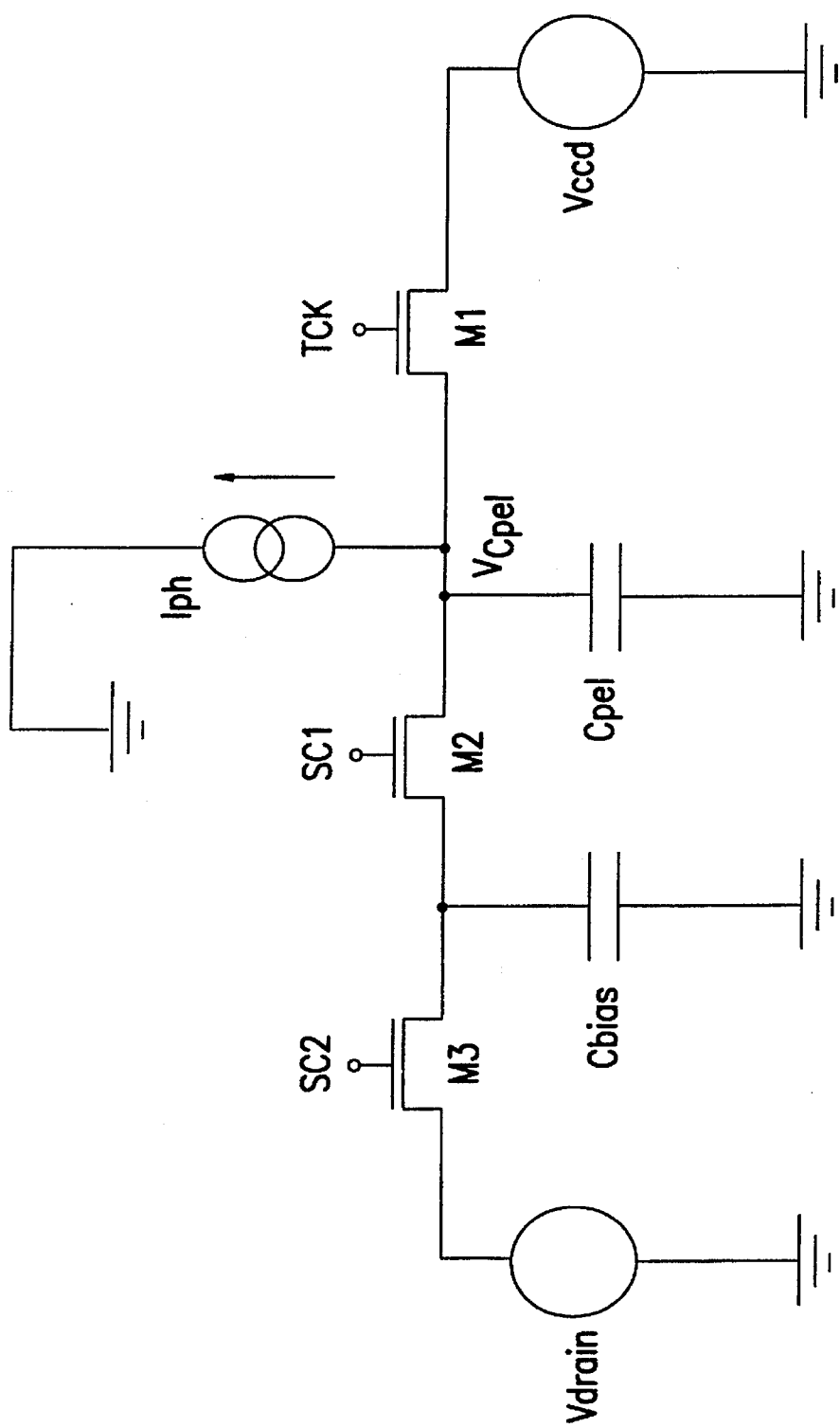
FIG. 7 is a schematic diagram of an equivalent circuit of the switched CCD electrode photodetector.

FIG. 7 shows a schematic representation of a pixel with switched CCD electrodes. CCD gates are modelled as MOSFETs (M1, M2 and M3). The readout CCD is modelled as a positively biased voltage source ($V_{CCD}$) Since the readout shift register acts as a current 'sinking' voltage source. The switched CCD electrode resistor is modelled using M2, M3 and $C_{BIAS}$. A current source ($I_{pH}$) models the effect of the incident light intensity, and $C_{PEL}$ models the photocollection well capacitance. Signal charge units are transferred from $C_{PEL}$ into the CCD readout shift register, represented by $V_{CCD}$, at the end of the integration period by clocking TCK (M1), taking $C_{PEL}$ to a positive potential. During the initial stages of the integration period, signal electrons are collected reducing the $C_{PEL}$ potential and the source potential of M2. When the potential drops to a level such that M2 becomes conductive, signal charge units are shunted away from $C_{PEL}$ through the switched CCD electrode resistor. The switched CCD electrodes clock at a high frequency extracting charge packets onto $C_{BIAS}$, proportional to the $C_{PEL}$ potential emulating a resistor. The $C_{PEL}$ potential continues to drop until the an equilibrium is achieved where the voltage drop across the resistor is large enough to shunt all of the photogenerated current away from $C_{PEL}$. For low light levels, the amount of signal charge collected is too small to cause M2 to become conductive; all of the signal electrons are collected for maximum sensitivity. For brighter light levels when M2 becomes conductive, the device operates in a compression state to extend dynamic range.

Figure 8:
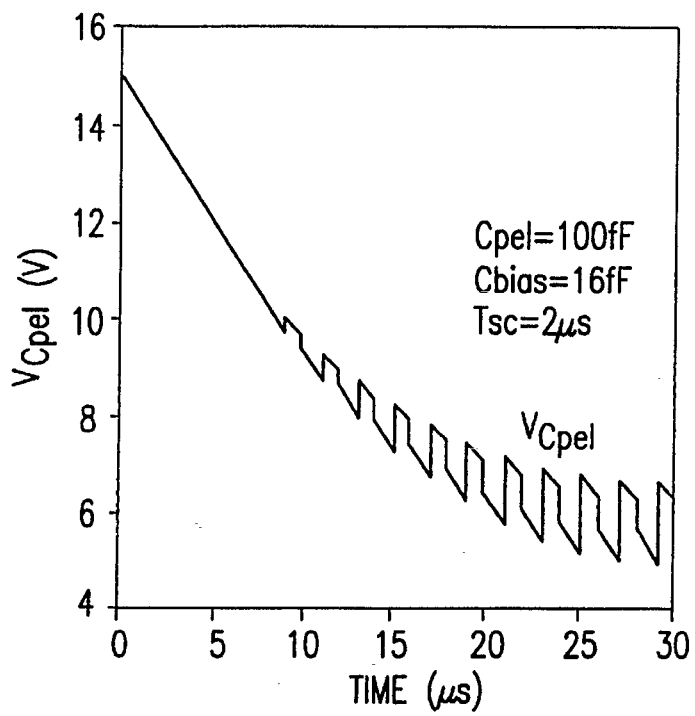
FIGS. 8 and 9 are graphs showing simulated photodetector voltages obtained with the switched CCD electrode photodetector.

Capacitor $C_{PEL}$ models the capacitance of the photocollection well and is precharged to 15 V. FIG. 8 shows the photocollection well voltage ($v_{CPEL}$) as a function of time. At the beginning of the simulation, $C_{PEL}$ is precharged to 15 V. The photogenerated signal charge modelled by $I_{pH}$ collects on $C_{PEL}$ reducing its voltage until it is low enough to start interacting with the switched CCD electrode resistor. At this point, the $C_{PEL}$ voltage pulses due to the changing $C_{PEL}$ capacitance as the SC 1 and SC2 electrodes alternately turn 'on' and 'off' removing excess signal charge from the collection well to the drain. The average voltage slowly decreases until equilibrium is reached where the rate of charge removal equals the rate of charge photogeneration. The equilibrium potential, determined by the value of the resistance, is a function of the switching clock period and the size of $C_{BIAS}$.

Figure 9:
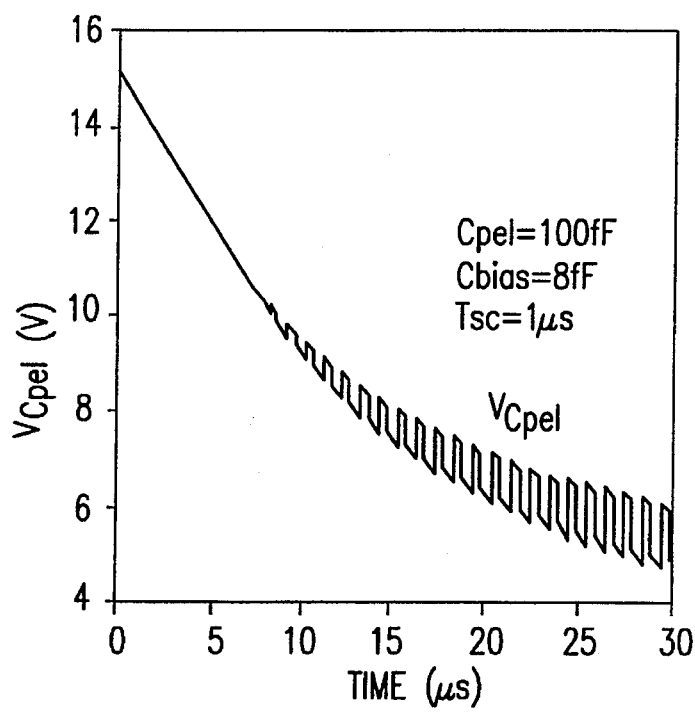

In FIG. 9 the same value of resistance is implemented except using half the switched clock period and half the $C_{BIAS}$ capacitance. The detector settles to the same average equilibrium potential. The amplitude of the pulsing, determined by the difference in capacitance with SC1 'on' and 'off', remains approximately the same. However, the amplitude of the voltage ramp at either extreme of the pulsing decreases. With half the switching clock period, half the charge accumulates before the resistor drains the charge. However, this occurs at twice the rate, resulting in the same net current flow.

Figure 10:
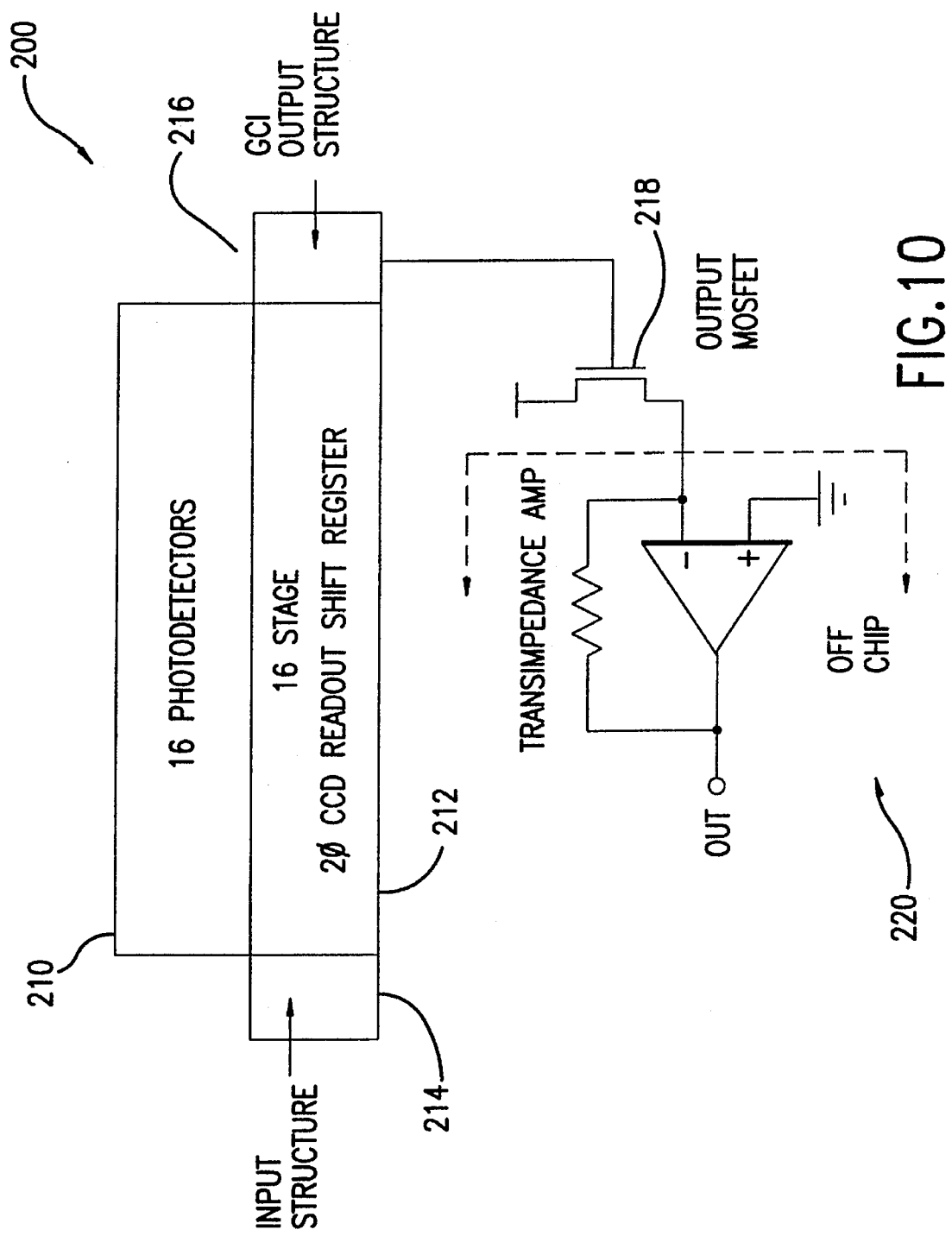
FIG. 10 is a combination block and schematic diagram showing a test structure incorporating the switched CCD electrode resistor photodetector.

In a development prototype, a CCD shift register and peripheral circuitry was fabricated as test device 200 to test the switched CCD electrode photodetector. Test device 200 is shown in the block diagram of FIG. 10 together with off chip transimpedance amplifier 220. Device 200 included array 210 of sixteen photodetectors, each photodetector being constructed as photodetector 100. Device 200 further included CCD readout shift register 212 with its associated input structure 214 and GCI (gated charge integrator) output structure 216. Input structure 214 created charge packets for insertion into the CCD readout shift register as an aid for characterization of shift register parameters. GCI output structure 216 applied charge packets received from the CCD readout shift register onto a capacitance node so that the charges express an output voltage. GCI output structure 216 was coupled to output transistor 218. Output transistor 218 of device 200 was coupled to external (i.e., off chip) transimpedance amplifier 220.

Signal charges collected in the photodetectors were transferred in parallel into CCD readout shift register 212 at the end of the integration time. The signal charges were then serially transferred out of CCD readout shift register 212 into the buffered output structure (comprising GCI output structure 216 and output transistor 218). The test circuit including GCI output structure 216, transistor 218 and transimpedance amplifier 220 had an overall conversion efficiency of 0.9 µV/e–.

The CCD device was fabricated on a 20 µm thick p-type 30–50Ω - cm epitaxial layer on a heavily doped p-type substrate. A double polysilicon, double metal n-type buried channel CCD process using 2 µm design rules was used. A second layer metal was used as a light shield. Masked boron ion-implantation underneath the second polysilicon was used to implement two phase CCDs. All channel regions were formed with either polysilicon layer (i.e., either poly 1 or poly 2 in FIG. 6) over an $SiO_2/Si_3N_4$ gate dielectric. Conventional LOCOS (a known process step where $SiO_2$ is selectively grown on semiconductor regions not covered by $Si_3N_4$) type channel stops were used to isolate adjacent photodetectors.

Figure 11:
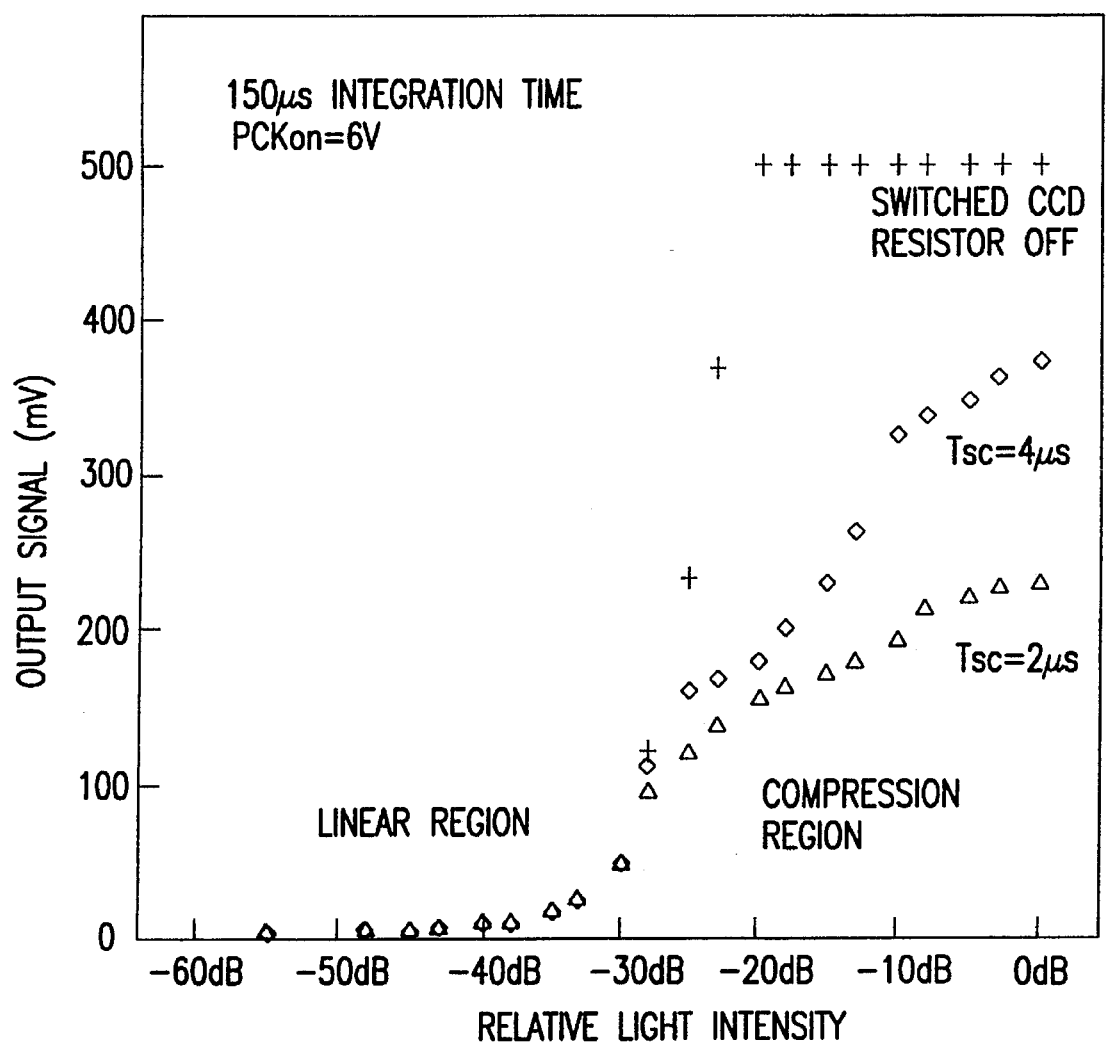
FIG. 11 is a graphical plot of the measured response of the output of the test structure as a function of relative light intensity for different switched CCD electrode clocking periods.

FIG. 11 shows the measured response of the photodetector shown in FIG. 4A illuminated with a 760 nm laser diode at an integration time of 150 µs on a linearlogarithmic graph. The output signal on the graph refers to the output voltage at the output of transimpedance amplifier 220. Note that this voltage signal is smaller than the voltage signals at the photodetector site. Two regions of operation are observed: one region at lower light levels and the other region at higher light levels. The lower 30 dB is the linear response region where just the PCK and SCK electrodes are filling and there is no interaction with the switched CCD electrode resistor. For the upper 30 dB of operation, the photodetector response is a function of the switched CCD electrode clock period. A smaller period results in a smaller resistor and, therefore, more signal compression. The uppermost curve shows response without switched CCD electrode compression. Due to the complete charge transfer characteristics of the CCD electrodes used in this photodetector, no image lag could be measured.

Figure 12:
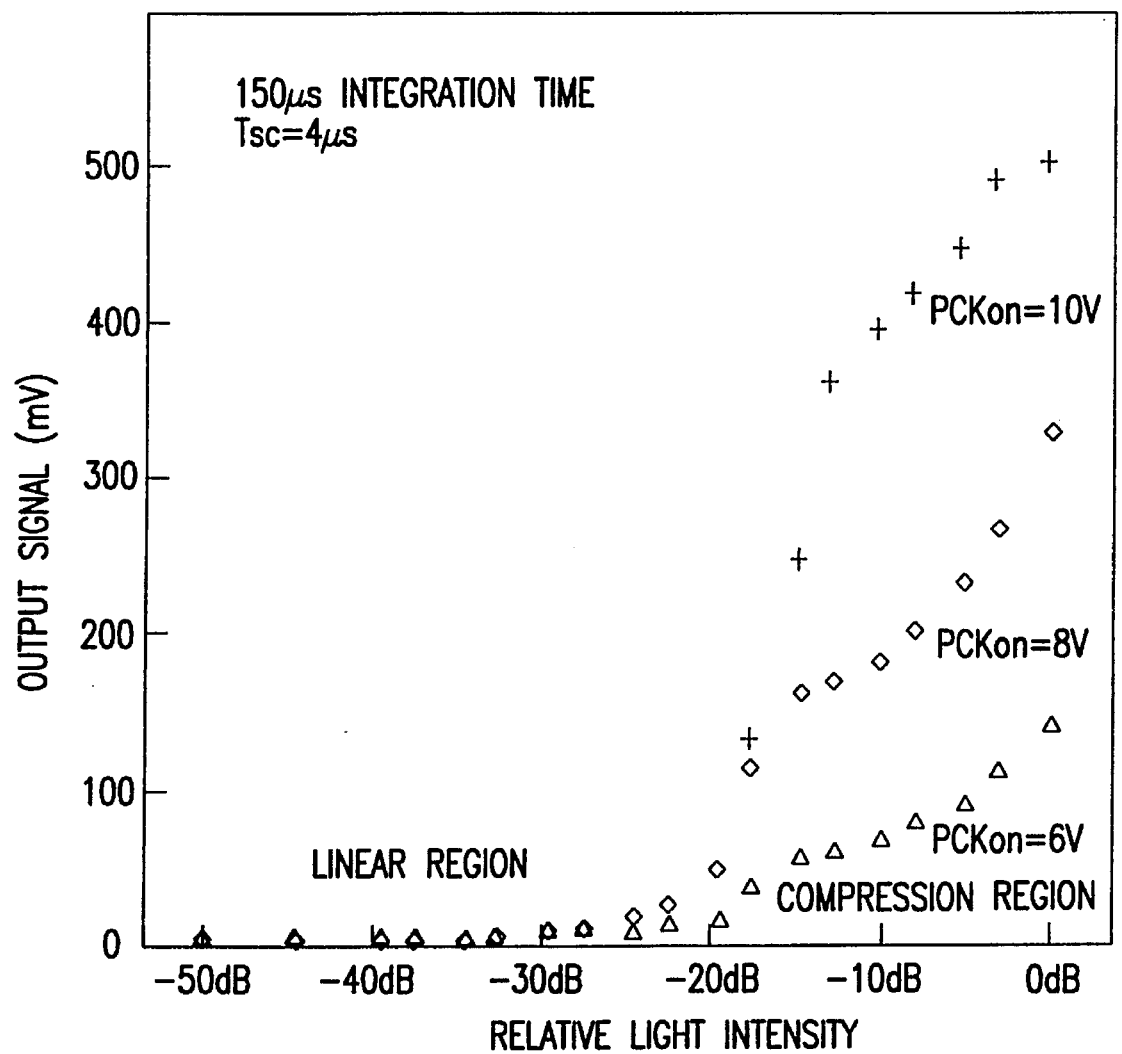
FIG. 12 is a graphical plot of the measured response of the output of the test structure as a function of relative light intensity for different collection well depths.

The light intensity at the transition between the two regions of operation with different switched CCD electrode clock periods is the same. This is because the PCK potential well depth is the same for the different switched CCD electrode clock periods. FIG. 12 shows the effect of varying the collection well electrode depth on the boundary between the two modes of operation. By changing the switched CCD electrode frequency and collection well electrode potential, the detector response can be tailored for different applications using control means external to the photodetector element.

The photodetector achieves a dynamic range of 60 dB without image lag. All of the signal charge units at low light levels are collected to maximize sensitivity. At high light levels, a portion of the collected photogenerated signal charge units are discarded through a switched CCD electrode resistor implementation. The compression response of the detector is a function of user controlled clock frequencies using control means external to the photodetector element. The light level at which signal charge compression starts to occur is a function of user specified clock levels. As a result, this photodetector can be fabricated and then adapted after fabrication to many different types of applications depending on the required characteristics by adjusting the clock frequency of the switched CCD electrode resistor and by adjusting the collection well voltage.

Having described preferred embodiments of a novel photodetector (which are intended to be illustrative and not limiting), it is noted that modifications and variations can be made by those skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims.

What is claimed is:

1. A photodetector comprising:

a substrate of a first conductivity type;

a drain of a second conductivity type formed in the substrate;

a collection well formed in the substrate within which photocharge is generated; and a charge coupled device provided between the collection well and the drain and operable to transfer a portion of the photocharge from the collection well to the drain, the charge coupled device having a channel region with a central portion, a ratio of the charge coupled device being defined by a ratio of a potential difference between the collection well and the central portion and a resulting current flowing through the charge coupled device, the resulting current being proportional to the potential difference between the collection well and the central portion.

2. The photodetector of claim 1, wherein:

the channel region has a first end disposed adjacent to the collection well and a second end disposed adjacent to the drain, and the charge coupled device includes a first electrode insulatively spaced from and disposed over the first end and a second electrode insulatively spaced from and disposed over the second end.

3. The photodetector of claim 2, wherein the charge coupled device further includes a bias electrode disposed between the first and second electrodes and insulatively spaced over the central portion of the channel region.

4. The photodetector of claim 3, further including:

a voltage supply connected to the drain to apply a drain voltage thereto, the voltage supply being further connected to the substrate to apply a substrate voltage thereto; and a bias supply connected to the bias electrode to apply a bias voltage thereto, the bias voltage being a voltage between the drain voltage and the substrate voltage.

5. The photodetector of claim 4, further including a clock supply connected to the first electrode to provide a first voltage thereto, the clock supply being further connected to the second electrode to apply a second voltage thereto, the clock supply controlling the first and second voltages initially to transfer the portion of the photocharge from the collection well to the central portion while blocking charge transfer between the central portion to the drain and then subsequently to transfer the portion of the photocharge from the central portion to the drain while blocking charge transfer between the collection well and the central portion.

6. The photodetector of claim 5, wherein the clock supply controls the first and second voltages so that:

the first voltage is a voltage between the bias voltage and an empty collection well potential when the portion of the photocharge is transferred from the collection well to the central portion while blocking charge transfer between the central portion to the drain; and the second voltage is a voltage between the drain voltage and the bias voltage when the portion of the photocharge is transferred from the central portion to the drain while blocking charge transfer between the collection well and the central portion.

7. The photodetector of claim 2, further including a clock supply connected to the first electrode to provide a first voltage thereto, the clock supply being further connected to the second electrode to apply a second voltage thereto.

8. The photodetector of claim 7, wherein the collection well accumulates charge and the clock supply includes a controller to control the first and second voltages such that:

during a first period, the first voltage is set to a first value and the second voltage is set to a second value to transfer a portion of the charge in the collection well to the central portion of the channel region while blocking charge transfer between the central portion of the channel region and the drain; and during a second period, the second voltage is set to a third value and the first voltage is set to a fourth value to transfer charge from the central portion of the channel region to the drain while blocking charge transfer between the collection well and the central portion of the channel region.

9. The photodetector of claim 8, wherein the controller controls the first voltage to alternate between the first and fourth values to define the first and second periods to repeat in cycles at a predetermined cycle rate, the ratio of the charge coupled device being proportional to the cycle rate.

10. The photodetector of claim 1, wherein:

the charge coupled device includes first and second electrodes; and the photodetector further includes a clock supply coupled to the first and second electrodes, the clock supply being characterized by a clock frequency, the ratio of the charge coupled device being proportional to the clock frequency.

11. The photodetector of claim 1, wherein the charge coupled device includes a bias electrode insulatively spaced from and disposed over the central portion of the channel region.

12. The photodetector of claim 11, wherein a bias well is formed in the central portion of the channel region by application of a bias signal to the bias electrode.

13. The photodetector of claim 12, wherein:

the channel region has a first end disposed adjacent to the collection well and a second end disposed adjacent to the drain; and the charge coupled device circuit further includes a first electrode insulatively spaced from and disposed over the first end and a second electrode insulatively spaced from and disposed over the second end.

14. The photodetector of claim 1, wherein:

the charge coupled device includes a bias electrode insulatively spaced from and disposed over the central portion;

a responsivity of the photodetector is defined by an incremental change of a photodetector output due to an incremental change of an intensity of light impinging on the photosensitive region divided by the incremental change in the intensity; and a bias well is formed in the central portion of the channel region by application of a bias signal to the bias electrode, the bias signal controlling an intensity threshold below which the photodetector is characterized by a first responsivity and above which the photodetector is characterized by the second responsivity, the first responsivity being greater than the second responsivity.

15. In a photodetector formed in a substrate of a first conductivity type and having a drain of a second conductivity type and having a collection well within which photocharge is generated, a charge coupled device circuit comprising:

a channel region defined in the substrate, the channel region having a first end disposed adjacent to the collection well and a second end disposed adjacent to the drain, the channel region operable to transfer a portion of the photocharge from the collection well to the drain;

a first electrode insulatively spaced from and disposed over the first end, a first signal being applied to the first electrode, the first signal alternating between a first value and a second value in a plurality of cycles at a predetermined frequency; and a second electrode insulatively spaced from and disposed over the second end, a second signal being applied to the second electrode, the second signal having the first value when the first signal has the second value, the second signal having the second value when the first signal has the first value, the charge coupled device circuit discharging charge from the collection well to the drain at a discharge rate proportional to the predetermined frequency.

16. The circuit of claim 15, further comprising a bias electrode disposed between the first and second electrodes and insulatively spaced over a central portion of the channel region.

17. The circuit of claim 16, further comprising:

a voltage supply connected to the drain to apply a drain voltage thereto, the voltage supply being further connected to the substrate to apply a substrate voltage thereto; and a bias supply connected to the bias electrode to apply a bias voltage thereto, the bias voltage being a voltage between the drain voltage and the substrate voltage.

18. The circuit of claim 17, further including a clock supply connected to the first electrode to provide a first voltage thereto, the clock supply being further connected to the second electrode to apply a second voltage thereto, the clock supply controlling the first and second voltages initially to transfer the portion of the photocharge from the collection well to the central portion while blocking charge transfer between the central portion to the drain and then subsequently to transfer the portion of the photocharge from the central portion to the drain while blocking charge transfer between the collection well and the central portion.

19. The photodetector of claim 18, wherein the clock supply controls the first and second voltages so that:

the first voltage is a voltage between the bias voltage and an empty collection well potential when the portion of the photocharge is transferred from the collection well to the central portion while blocking charge transfer between the central portion to the drain; and the second voltage is a voltage between the drain voltage and the bias voltage when the portion of the photocharge is transferred from the central portion to the drain while blocking charge transfer between the collection well and the central portion.

20. The circuit of claim 15, further comprising a clock supply connected to the first electrode to provide the first signal thereto, the clock supply being further connected to the second electrode to apply the second signal thereto.

21. The circuit of claim 20, wherein the collection well accumulate charge and the clock supply includes a controller to control the first and second signals such that:

during a first period, the first signal is set to the first value and the second signal is set to the second value to transfer a portion of the charge in the collection well to a central portion of the channel region while blocking charge transfer between the central portion of the channel region and the drain; and during a second period, the second signal is set to the first value and the first signal is set to the second value to transfer charge from the central portion of the channel region to the drain while blocking charge transfer between the collection well and the central portion of the channel region.

22. The circuit of claim 21, wherein:

the collection well accumulates charge from the photosensitive region over a collection time; and the controller controls the first and second signals so that the plurality of cycles includes at least ten cycles during the collection time.

23. A photodetector comprising:

a substrate of a first conductivity type;

a drain of a second conductivity type formed in the substrate;

a collection well formed in the substrate to receive photocharge; and a charge coupled device provided between the collection well and the drain, the charge coupled device having a channel region with a central portion, the charge coupled device operating to transfer a portion of the photocharge from the collection well to the central portion, the charge coupled device also operating to transfer a charge packet from the central portion to the drain, the charge packet including only the portion of the photocharge transferred from the collection well to the central portion.

24. The photodetector of claim 23, wherein:

the photodetector senses radiation during an integration time;

the portion of the photocharge is a first photocharge portion of a plurality of successive photocharge portions, the plurality successive photocharge portions being successively transferred from the collection well during the integration time.

25. The photodetector of claim 23, wherein a ratio of a potential difference between the collection well and the central portion when a photocharge portion is transferred from the collection well divided by the charge in the photocharge portion is a constant for each photocharge portion transferred from the collection well.

26. A photodetector comprising:

a substrate of a first conductivity type;

a drain of a second conductivity type formed in the substrate;

a collection well formed in the substrate within which all photocharge is generated; and a charge coupled device provided between the collection well and the drain, the charge coupled device having a channel region with a central portion, the charge coupled device operating to transfer a portion of the photocharge from the collection well to the central portion and then transfer the portion of the photocharge from the central portion to the drain.

27. The photodetector of claim 26, wherein:

the photodetector senses radiation during an integration time;

the portion of the photocharge is a first photocharge portion of a plurality of successive photocharge portions, the plurality successive photocharge portions being successively transferred to the drain during the integration time.

28. The photodetector of claim 27, wherein a ratio of a potential difference between the collection well and the central portion when a photocharge portion is transferred from the collection well divided by the charge in the photocharge portion is a constant for each photocharge portion transferred to the drain.

29. A photodetector to sense radiation during an integration time comprising:

a substrate of a first conductivity type;

a drain of a second conductivity type formed in the substrate;

a collection well formed in the substrate to receive photocharge; and a charge coupled device provided between the collection well and the drain, the charge coupled device having a channel region with a central portion, the charge coupled device operating to transfer a charge packet from the photocharge collected in the collection well to the central portion and then transfer the charge packet from the central portion to the drain, the charge packet being a first charge packet of a plurality of successive charge packets, the charge coupled device operating to repeat the transfer of a charge packet from the collection well to the central portion to the drain so as to successively transfer the plurality of successive charge packets from the collection well to the drain during the integration time.

30. The photodetector of claim 29, wherein a ratio of a potential difference between the collection well and the central portion when a charge packet is transferred from the collection well divided by the charge in the charge packet is a constant for each charge packet transferred to the drain.

31. In a photodetector for measuring a light intensity, the photodetector including a drain, a collection well and a charge coupled device coupled therebetween, the charge coupled device having a channel region with a central portion, a method comprising steps of:

generating and accumulating photocharge in the collection well during an integration time at a rate proportional to the light intensity, the photocharge accumulated in the collection well defining a collection well potential;

discarding a portion of the accumulated photocharge into the drain at a discard rate when the collection well potential is more negative than a threshold potential, the discard rate being proportional to a potential difference between the collection well and the central portion of the channel region; and transferring a remaining portion of the accumulated photocharge to an output at an end of the integration time.

32. The method of claim 31, wherein the photodetector includes a clock supply characterized by a clock frequency coupled to the charge coupled device, the discard rate being proportional to the clock frequency.

33. The method of claim 31, wherein:

the integration time includes a plurality of discard intervals;

each discard interval includes first and second periods;

during the first period, the step of discarding includes transferring the portion of the accumulated photocharge from the collection well to the central portion of the channel region while blocking charge transfer between the central portion of the channel region and the drain; and during the second period, the step of discarding includes transferring the portion of the accumulated photocharge from the central portion of the channel region to the drain while blocking charge transfer between the collection well and the central portion of the channel region.

34. The method of claim 33, wherein the plurality of discard intervals includes at least ten discard intervals.

* * * * *